United States Patent
Said et al.

(10) Patent No.: US 9,551,744 B2
(45) Date of Patent: Jan. 24, 2017

(54) DETECTING EARLY FAILURES IN PRINTED WIRING BOARDS

(71) Applicant: HAMILTON SUNDSTRAND CORPORATION, Windsor Locks, CT (US)

(72) Inventors: Waleed M. Said, Rockford, IL (US); Harold J. Hansen, Hamden, CT (US); Hamdi Kozlu, Burlington, CT (US); Charles V. DeSantis, Somers, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 496 days.

(21) Appl. No.: 13/886,927

(22) Filed: May 3, 2013

(65) Prior Publication Data
US 2014/0218065 A1   Aug. 7, 2014

Related U.S. Application Data

(60) Provisional application No. 61/760,551, filed on Feb. 4, 2013.

(51) Int. Cl.
*G01R 31/305* (2006.01)
*G01R 31/28* (2006.01)

(52) U.S. Cl.
CPC ....... *G01R 31/2817* (2013.01); *G01R 31/2801* (2013.01)

(58) Field of Classification Search
CPC .............. G01R 31/2817; G01R 31/2801
USPC ............ 324/551, 763, 537, 763.01, 750.13, 324/757.02; 702/117
See application file for complete search history.

(56) References Cited

U.S. PATENT DOCUMENTS

| | | | |
|---|---|---|---|
| 3,889,188 A | | 6/1975 | Trindade |
| 4,904,946 A | | 2/1990 | Hirai |
| RE33,692 E | * | 9/1991 | Hirano ................. G01R 31/006 324/384 |
| 5,219,765 A | * | 6/1993 | Yoshida ................. H01L 22/20 148/DIG. 162 |
| 5,268,645 A | * | 12/1993 | Prokoff ............. G01R 31/2805 324/530 |
| 5,420,513 A | * | 5/1995 | Kimura ................ G01R 31/129 324/551 |
| 6,326,792 B1 | * | 12/2001 | Okada .................... G01N 27/92 324/456 |

(Continued)

FOREIGN PATENT DOCUMENTS

JP   2006266712 A   10/2006

OTHER PUBLICATIONS

Prendergast J et al.: TDDB characterisation of thin SiO2 films with bimodal failure populations, date Apr. 4, 1995, pp. 124-130.

(Continued)

*Primary Examiner* — Tung X Nguyen
*Assistant Examiner* — Dominic Hawkins
(74) *Attorney, Agent, or Firm* — Cantor Colburn LLP

(57) ABSTRACT

A method includes characterizing the effects of an electric field on a first set of printed wiring boards (PWBs) by testing the first set of PWBs to generate test data, using the test data to determine a dielectric life curve of the first set of PWBs, and based on the dielectric life curve, defining a screening time and a screening voltage to screen for premature failures in a second set of PWBs due to electric fields.

18 Claims, 5 Drawing Sheets

(56) References Cited

U.S. PATENT DOCUMENTS

| | | | | |
|---|---|---|---|---|
| 6,525,526 | B1* | 2/2003 | De Gruyter | G01R 31/2805 324/537 |
| 6,724,214 | B2* | 4/2004 | Manna | G01R 31/129 324/762.02 |
| 6,858,448 | B2* | 2/2005 | Okada | G11C 29/50016 324/456 |
| 6,873,171 | B2* | 3/2005 | Reynick | G01R 31/3008 324/762.01 |
| 6,967,499 | B1 | 11/2005 | Haase et al. | |
| 7,155,359 | B1* | 12/2006 | Kim et al. | 702/117 |
| 7,271,608 | B1* | 9/2007 | Vermeire | G01R 31/2856 324/750.3 |
| 8,053,257 | B2* | 11/2011 | Chanda | G06F 17/5009 257/E21.521 |
| 8,269,505 | B2* | 9/2012 | Cases | G01R 31/2812 324/527 |
| 9,032,257 | B2* | 5/2015 | Sashida | H04B 1/74 714/4.11 |
| 2001/0028256 | A1* | 10/2001 | Hayashi | G01R 31/312 324/754.21 |
| 2001/0045839 | A1* | 11/2001 | St-Onge | G01R 31/2818 324/750.3 |
| 2003/0016026 | A1* | 1/2003 | Kawaike | G01R 31/315 324/537 |
| 2007/0097597 | A1* | 5/2007 | Ko et al. | 361/311 |
| 2008/0278174 | A1* | 11/2008 | Li | B60L 3/0023 324/525 |
| 2009/0138772 | A1* | 5/2009 | Bertacco | G06F 11/2236 714/733 |
| 2014/0136879 | A1* | 5/2014 | Sashida | H04B 1/74 714/4.11 |

OTHER PUBLICATIONS

Combined Search and Examination Report under Sections 17 and 18(3) for Application No. GB1401844.4 Mailed on Jun. 19, 2014. 5 pages.

* cited by examiner

DETECTING EARLY FAILURES IN PRINTED WIRING BOARDS

BACKGROUND OF THE INVENTION

Embodiments of the invention relate to printed wiring boards and in particular to the detection of early failures in printed wiring boards due to the influence of electric fields.

Failures in printed wiring boards (PWBs), such as PWBs used for motherboards, have been associated with the motherboard having signals passing through laminated layers of copper traces separated by dielectric material. In other words, electric fields caused by electrical signals may damage the PWBs, leading to PWB failure.

Conventional burn-in techniques stress circuit components by subjecting the components to increased stress levels, such as increased heat and/or increased voltages for a relatively short period of time, relative to a life span of the components. The burn-in is designed to detect components that would fail prematurely during normal operation.

BRIEF DESCRIPTION OF THE INVENTION

Embodiments of the invention include a method includes characterizing the effects of an electric field on a first set of printed wiring boards (PWBs) by testing the first set of PWBs to generate test data, using the test data to determine a dielectric life curve of the first set of PWBs, and based on the dielectric life curve, defining a screening time and a screening voltage to screen for premature failures in a second set of PWBs due to electric fields.

Additional embodiments include a system for testing printed wiring boards (PWBs). The system includes a test development unit configured to generate electric fields in a first set of PWBs, to detect failures in the first set of PWBs based on the generated electric fields, to generate a dielectric life curve of the first set of PWBs, and, based on the dielectric life curve, to define a screening time and a screening voltage to screen for premature failures in a second set of PWBs.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Failures in printed wiring boards (PWBs) have been associated with the signals passing through laminated layers of copper traces separated by dielectric material. Embodiments of the invention are directed to screening PWBs to account for electric fields over a lifetime of the PWB.

Figure 1:
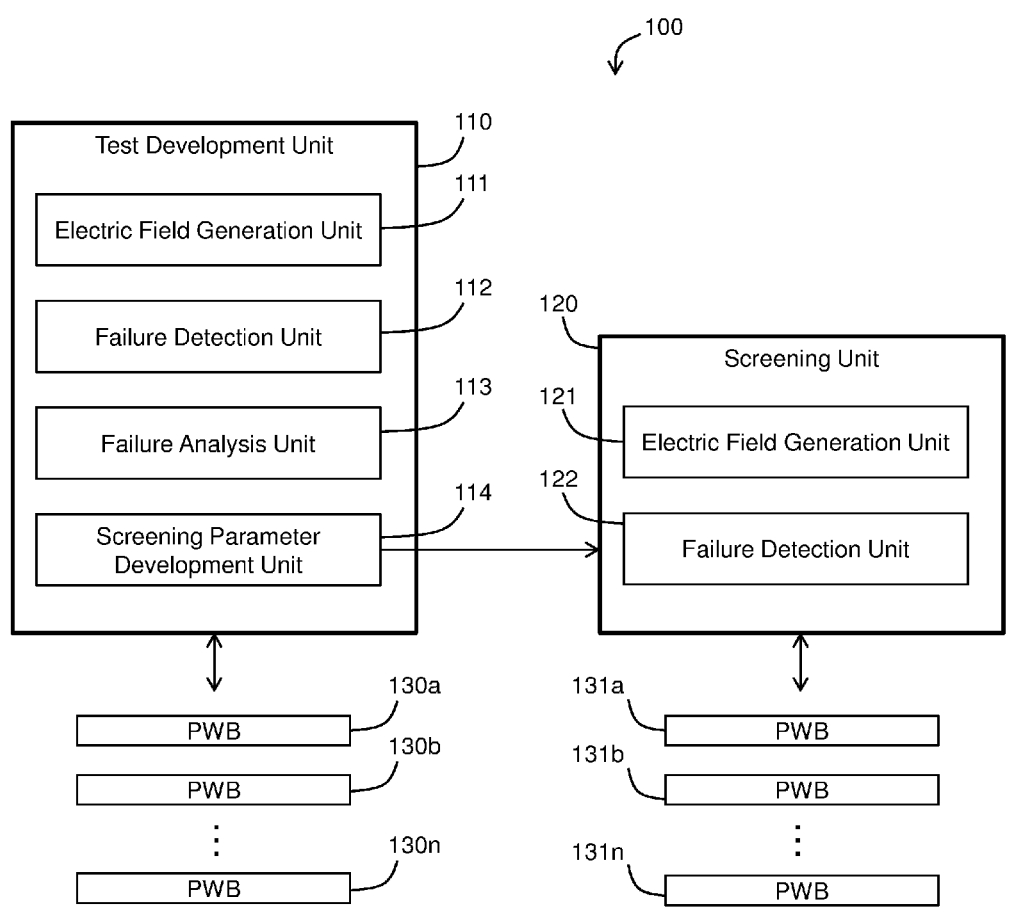
FIG. 1 illustrates a block diagram of a system for testing printed wiring boards (PWBs) according to an embodiment of the invention.

FIG. 1 illustrates a block diagram of a system 100 for testing printed wiring boards (PWBs) according to embodiments of the invention. The system 100 includes a test development unit 110 and a screening unit 120. The test development unit 110 is configured to generate electric fields in a first set of PWBs 130a, 130b to 130n, to detect failures in the first set of PWBs 130a to 130n based on the generated electric fields, to generate a dielectric life curve of the first set of PWBs 130a to 130n, and, based on the dielectric life curve, to define a screening time and a screening voltage to screen for premature failures in a second set of PWBs 131a, 131b to 131n.

In particular, the test development unit 110 includes an electric field generation unit 111, a failure detection unit 112, a failure analysis unit 113 and a screening parameter development unit 114. The electric field generation unit 111 is configured to generate an electric field in the first set of PWBs 130a-130n. The electric field is generated by supplying the first set of PWBs 130a-130n with a voltage sufficient to generate the electric field at the specified maximum operating frequency with only a minimal current, or a current less than an operating current. In one embodiment the voltage is set between 500 volts AC and 6000 volts AC at a frequency of 800 Hz and the current is between zero mA and 50 mA.

In operation, the electric field generation unit 111 applies the predetermined voltage and frequency to the first set of PWBs 130a-130n to generate the electric field in the first set of PWBs 130a-130n until a failure occurs in each of the PWBs 130a, 130b to 130n due to the generation of an electric field. In one embodiment, multiple PWBs are tested at multiple different voltages. For example, one set of PWB's may have 500 volts applied and another set may have 2500 volts applied.

Figure 2:
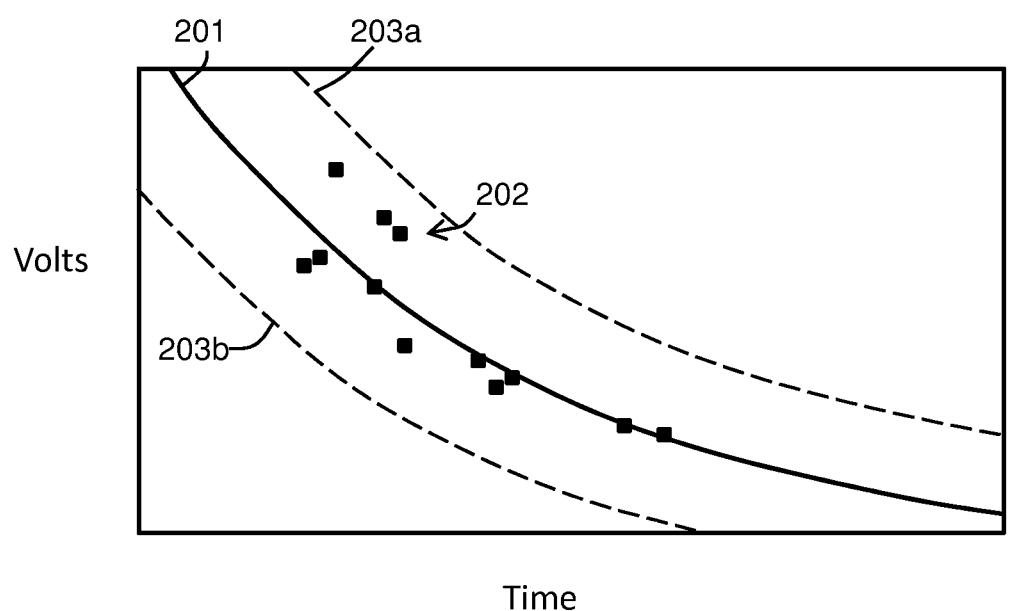
FIG. 2 illustrates a graph of a dielectric life curve according to an embodiment of the invention.

The failure detection unit 112 detects the dielectric breakdown failures of the PWBs 130a, 130b to 130n. The failure detection is accomplished by setting a predefined leakage current threshold level and detecting when that current is exceeded in the PWBs under test. The analysis unit 113 analyses the test data. In particular, the failure analysis unit 113 generates a dielectric life curve for the first set of PWBs 130a-130n and a failure rate curve. FIG. 2 illustrates a dielectric life curve 201 according to an embodiment of the invention. The data points 202 represent failure points of different PWBs. The data points 202 define the dielectric life curve 201, which may be based on averages, means medians or any other formula applied to the data points 202. In one embodiment, the data points 202 are fitted to a curve having a formula $y=ax^b$, where a and b are constants, and x and y represent values of the domain (x) corresponding to a test time and range (y) corresponding to a test voltage, respectively. The formula $y=ax^b$ represents a generic model for the life of polymers. The data points 202 are used to populate the model to identify the dielectric life curve 201 of the particular dielectrics of the PWBs 130a, 130b to 130n.

The curves 203a and 203b represent 3-sigma lines, or curves based on the dielectric life curve 201 that represent a range of values in which a majority of PWBs, or a number of PWBs within a predetermined threshold range of the dielectric life curve 201, fail. In one embodiment, the lines 203a and 203b define "normal" failure rates of PWBs and any PWB failures that correspond to curves below the line 203b are defined as "premature" failures. In other words, normal ranges of failure may be defined as falling within predetermined ranges of a dielectric life curve 201, and any failures that correspond to voltages and times below the curve 203b are defined as premature failures.

Figure 3:
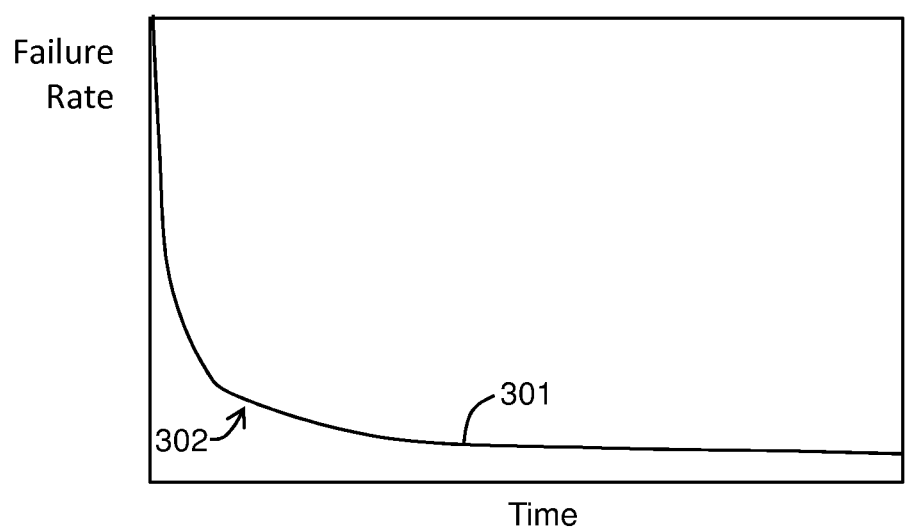
FIG. 3 illustrates a failure rate curve according to an embodiment of the invention.

The failure analysis unit 113 utilizes data corresponding to a failure rate curve, as illustrated in FIG. 3, where the failure curve 301 is defined by a failure time (domain) versus a failure rate (range). In particular, the failure rate curve 301 represents the relationship between failure times and failure rates of PWBs in the field. Such data may be gathered by operators or monitoring systems to generated the data that makes up the chart of FIG. 3. As illustrated in FIG. 3, the failure rate of PWBs is relatively high early in the lifetime of the PWB's and exponentially decreases along the life of the PWB. Accordingly, a failure time may be selected by a user or system to screen a majority of PWBs that fail prematurely by determining the time at which the majority of prematurely-failing PWBs fail.

As discussed above with respect to FIG. 2, a "premature" failure may be defined with respect to the dielectric life curve 201. For example, it may be determined that the curve 203b, defining a lower end of a normal operating range, has a data point corresponding to five hundred volts AC and one million hours. Accordingly, referring to FIG. 3, a time of just less than one million hours may be selected as defining a premature failure, and a data point along the curve 301 may be selected as a failure time reference according to a percentage of prematurely-failing PWBs that have failed at the selected data point.

In one embodiment, the failure curve 301 is based on the operation of PWBs under normal operating conditions, such as normal voltages and current levels in the field. In one embodiment, a user or system selects the time associated with an inflection point 302 to determine the screening time of an electric field screening test. In one embodiment, the failure data associated with the curve 301 may be provided to the failure analysis unit 113 by a user or data communication port, and the failure analysis unit 113 may detect the location of the inflection point 302. For example, the inflection point 302 may correspond to a failure time of five hundred hours of in-field use at a predetermined voltage, such as five hundred volts AC. Then, the failure time of five hundred hours may be used to determine the duration of a screening test by using the selected failure time or a multiple of the selected failure time.

While the inflection point 302 has been provided as one example of a data point that may be used to select a screening test reference time, embodiments of the invention encompass the selection of any data point corresponding to any desired failure rate or failure time criteria. For example, the screening test duration may be selected based on a fraction of PWBs that have failed, such as fifty percent, sixty percent or any other fraction or percentage of PWBs that have failed. In one embodiment, the failure rate curve is generated by performing a Weibull analysis or another statistical distribution analysis of the PWB failure data.

Figure 4:
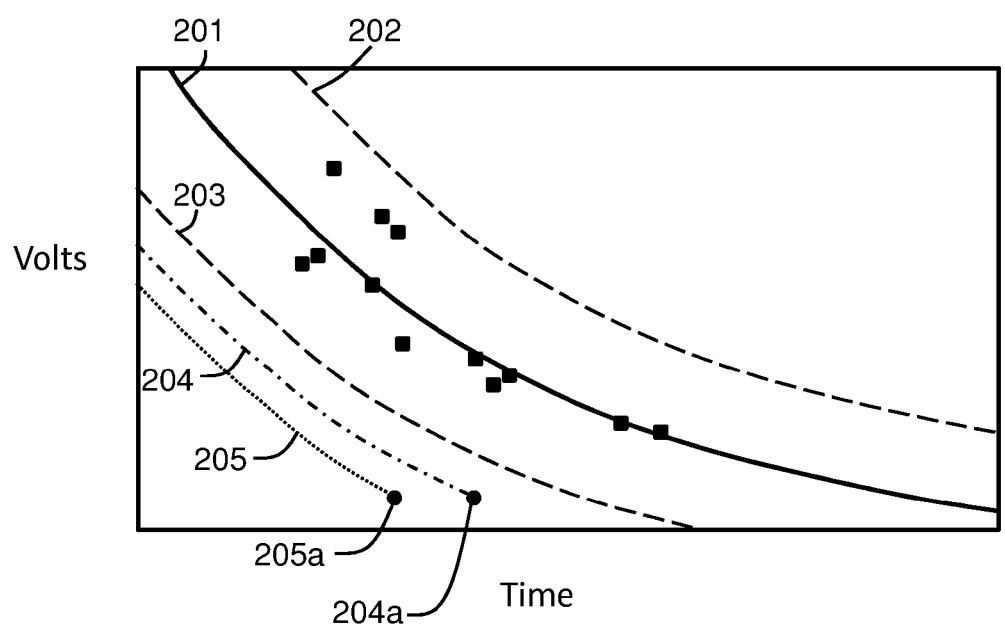
FIG. 4 illustrates a graph of a screening curve according to an embodiment of the invention.

Once the desired failure time has been selected based on the failure rate curve to capture a desired percentage of early-failing PWBs, the screening parameter development unit 114 generates a screening curve to select screening parameters, including a screening test time and screening test voltage and frequencies. Referring to FIG. 4, example screening curves 204 and 205 are illustrated. In one embodiment, a data point 205a corresponds to a failure of a PWB after 500 hours of testing at 500 volts AC. The screening parameter development unit 114 generates the screening curve 205 by transposing the dielectric life curve 201 onto the data point 205a. Accordingly, any point along the screening curve 205 may be selected to obtain a screening time and a screening voltage to screen out PWBs having a life of 500 hours at 500 volts AC. For example, one point along the curve 205 may correspond to 500 hours at 500 volts AC, another point along the curve 205 may correspond to 170 hours at 1500 volts, and yet another point along the curve 205 may correspond to one hour at 2000 volts AC. Accordingly, the screening parameter development unit 114 may select screening parameters of one hour, one hundred seventy hours or any other time along the curve 205 and the corresponding voltages to perform an electric field screening test of PWBs. Such tests would screen out PWBs that would fail due to electrical field damage within and including five hundred hours of operation at five hundred volts.

While the screening parameters may be selected based on the failure time corresponding to a predetermined percentage of failed PWBs, the screening parameters may also be selected to provide a buffer. For example, if it is determined by the failure analysis unit 113 that seventy percent of PWBs that fail prematurely fail within five hundred hours of testing at five hundred volts AC, corresponding to the data point 205a, a data point 204a may be selected, corresponding to a failure of a PWB after one thousand hours of testing at five hundred volts to provide a buffer to ensure that a desired number of prematurely failing PWBs are screened. The screening curve 204 may be calculated by transposing the dielectric life curve 201 onto the data point 204a, or by transposing the dielectric life curve 201 to correspond to the data point 204a. Accordingly, any point along the screening curve 204 may be selected to obtain a screening time and a screening voltage to screen out PWBs having a life of 100 hours at 500 volts AC. For example, another point along the curve 204 may correspond to one hour and one thousand eight hundred volts AC, and the screening parameter development unit 114 may select screening parameters, including a screening test time and a screening test voltage to correspond to any point along the curve 204.

Once the screening parameters are selected by the screening parameter development unit 114, the test development unit 110 transmits the screening parameters to the screening unit 120. The screening unit 120 includes an electric field generation unit 121 and a failure detection unit 122. The electric field generation unit 121 performs the electric field screening test according to the selected screening parameters, to have a duration and a voltage based on the selected screening parameters. The failure detection unit 122 detects PWBs from the second set of PWBs 131a, 131b to 131n that have failed, and the remaining PWBs are cleared to be used in an operating environment.

While FIG. 1 illustrates the test development unit 110 and the screening unit 120 as being separate elements, in embodiments of the invention, the test development unit 110 and the screening unit 120 may be either part of the same device or separate devices. For example, in one embodiment, the test development unit 110 includes a power supply or voltage generator and a computer including a processor and memory to detect and store PWB failure data, to analyze the failure data and to generate the screening parameters. Similarly, the screening unit 120 may include a power supply or voltage generator to generate an electric field and a computer including a processor and memory and appropriate sensors to detect and store failure data. In one embodiment, the power supplies of the test development unit 110 and the screening unit 120 are the same, or the processors and memory of the test development unit 110 and the screening unit 120 are the same. In alternative embodiments, the test development unit 110 and screening unit 120 are separate devices connected via wires, wirelessly or any other network.

Figure 5:
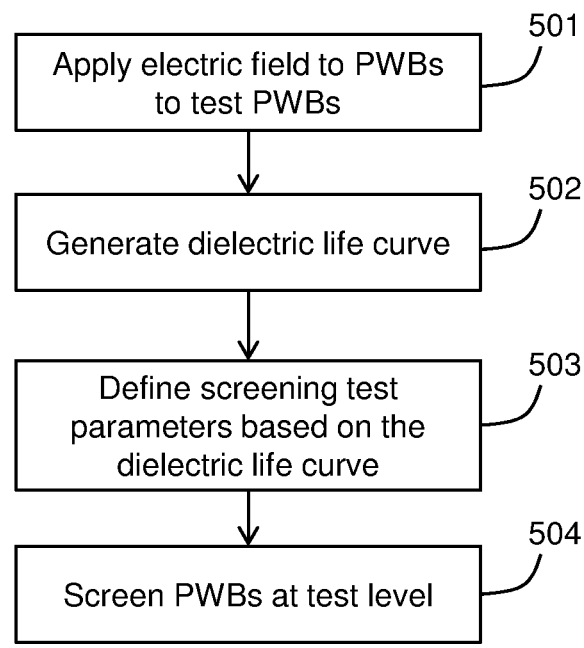
FIG. 5 illustrates a flow diagram of a method according to an embodiment of the invention.

FIG. 5 illustrates a flow diagram of a method according to an embodiment of the invention. In block 501, electric fields are supplied to printed wiring boards (PWBs) to generate test data. The electric fields may be supplied by supplying a high voltage and a minimal current, which may be only a leakage current, such as 50 mA or less to the PWBs. In one embodiment, multiple PWBs may be tested, such that at least one set is tested at a first voltage and another set is tested at another voltage. In one embodiment, voltages are applied to the PWBs at multiples of an operating voltage of the PWBs to simulate a lifetime duration of the PWBs.

In block 502, a dielectric life curve is generated based on the test data collected from applying the electric fields to the PWBs. The dielectric life curve may be generated by fitting a plurality of data points corresponding to failed PWBs to a generic model for the life of polymers.

In block 503, screening test parameters are defined based on the dielectric life curve. The screening test parameters may include a screening time and a screening voltage. The screening time and the screening voltage may be selected based on a screening curve based on the dielectric life curve fitted to a data point of a prematurely failed PWB.

In block 504, the screening parameters are applied to additional PWBs to screen out prematurely-failing PWBs that fail prematurely based on electric fields generated by conductive traces or wiring on or in the PWBs.

In one embodiment, a failure rate time is calculated by supplying the same AC voltage to traces of multiple PWBs and generating a failure rate curve based on the failure times of the multiple PWBs. A point on the failure rate curve may be selected to capture a predetermined percentage of prematurely-failing PWBs. The point may define a failure time that is used to select a screening test time. In one embodiment, the failure rate time is used as a basis for selecting a data point of a failed PWB on the graph including the dielectric life curve. For example, the dielectric life curve may be transposed onto a data point corresponding to a failed PWB at the failure rate time. The screening time and the screening voltage may then be selected to correspond to a point along the transposed dielectric life curve.

Embodiments of the invention provide the ability to predict the life expectancy of a population of a PWB and provide a test method to screen out boards that might fail prematurely. While embodiments have been described with reference to printed wiring boards, embodiments of the invention encompass any electrical devices having dielectric materials that are damaged by electrical fields.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method, comprising:
characterizing the effects of an electric field on a first set of printed wiring boards (PWBs) by testing the first set of PWBs to generate test data, the PWBs each comprising laminated layers of copper traces separated by dielectric material, wherein the testing comprises applying a voltage to the first set of PWBs until dielectric breakdown failures of the dielectric material of the PWBs occurs;
using the test data to determine a dielectric life curve of the first set of PWBs; and
based on the dielectric life curve of the first set of PWBs, defining a screening time and a screening voltage to screen for premature dielectric breakdown failures in a second set of PWBs due to electric fields.

2. The method of claim 1, wherein characterizing the effects of the electric field on the first set of PWBs includes applying a voltage to the first set of PWBs that is a multiple of an operating voltage of the first set of PWBs to simulate a life duration of the first set of PWBs in a compacted period of time.

3. The method of claim 1, wherein the screening time and screening voltage are selected based on a screening curve generated by fitting the dielectric life curve onto a data point corresponding to a prematurely failed PWB.

4. The method of claim 1, wherein characterizing the effects of the electric field on the first set of PWBs includes applying different voltages to the conductive traces of the first set of PWBs, and
generating the test data includes detecting failure times of the first set of PWBs.

5. The method of claim 4, wherein defining the screening time and the screening voltage includes fitting the test data from the first set of PWBs to a generic curve defining polymers to generate the dielectric life curve, and
generating a screening curve by transposing the dielectric life curve.

6. The method of claim 5, wherein defining the screening time and the screening voltage includes selecting the screening voltage and the screening time from the screening curve to test the second set of PWBs.

7. The method of claim 6, wherein selecting the screening voltage and the screening time comprises:
generating a failure rate curve based on the test data; and
determining a first time corresponding to a duration of test time at which a threshold percentage of PWBs has failed among the first set of PWBs,
wherein the screening voltage and the screening time are selected based on the first time.

8. The method of claim 7, wherein the first time is determined based on identifying an inflection point of the failure rate curve.

9. The method of claim 1, further comprising:
performing an electrical field test on the second set of PWBs by applying the screening voltage to the second set of PWBs for the screening time.

10. A system for testing printed wiring boards (PWBs), comprising:
a test development unit configured to generate electric fields in a first set of PWBs, the PWBs each comprising laminated layers of copper traces separated by dielectric material, to detect dielectric breakdown failures in the first set of PWBs based on the generated electric fields, to generate a dielectric life curve of the first set of PWBs, and, based on the dielectric life curve, to define a screening time and a screening voltage to screen for premature dielectric breakdown failures in a second set of PWBs.

11. The system of claim 10, further comprising a screening unit configured to test the second set of PWBs for a duration corresponding to the screening time at the screening voltage.

12. The system of claim 10, wherein the test development unit is configured to characterize the effects of the electric field on the first set of PWBs by applying a voltage to the first set of PWBs that is a multiple of an operating voltage of the first set of PWBs to simulate a life duration of the first set of PWBs in a compacted period of time.

13. The system of claim 10, wherein the test development unit is configured to select the screening time and screening voltage based on a screening curve generated by fitting the dielectric life curve onto a data point corresponding to a prematurely failed PWB.

14. The system of claim 10, wherein the test development unit is configured to characterize the effects of the electric field on the first set of PWBs by applying a same voltage level to the conductive traces of the first set of PWBs, and to generate the test data by detecting failure times of the first set of PWBs.

15. The system of claim 14, wherein the test development unit is configured to define the screening voltage and the screening time by fitting the test data from the first set of PWBs to a PWB life duration curve, and to generate a screening curve by transposing the dielectric life curve.

16. The system of claim 15, wherein the test development unit is configured to select the screening voltage and the screening time from a data point on the screening curve to test the second set of PWBs.

17. The system of claim 16, wherein the test development unit is configured to select the screening voltage and the screening time by generating a failure rate curve based on the test data and determining a first time corresponding to a duration of test time at which a threshold percentage of PWBs has failed among the first set of PWBs, and wherein the test development unit is configured to select the screening voltage and the screening time based on the first time.

18. The system of claim 17, wherein the first time is determined based on identifying an inflection point of the failure rate curve.

* * * * *